(12) United States Patent
Nakaoka et al.

(10) Patent No.: US 11,469,119 B2
(45) Date of Patent: Oct. 11, 2022

(54) SUBSTRATE TREATMENT APPARATUS

(71) Applicant: Kioxia Corporation, Tokyo (JP)

(72) Inventors: Satoshi Nakaoka, Yokkaichi (JP);
Yoshinori Kitamura, Tsu (JP);
Katsuhiro Sato, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 266 days.

(21) Appl. No.: 16/542,831

(22) Filed: Aug. 16, 2019

(65) Prior Publication Data

US 2020/0273727 A1 Aug. 27, 2020

(30) Foreign Application Priority Data

Feb. 21, 2019 (JP) .............................. JP2019-029748

(51) Int. Cl.
*H01L 21/67* (2006.01)
*H01L 21/311* (2006.01)

(52) U.S. Cl.
CPC .. *H01L 21/67075* (2013.01); *H01L 21/31111* (2013.01); *H01L 21/67092* (2013.01)

(58) Field of Classification Search
None
See application file for complete search history.

(56) References Cited

U.S. PATENT DOCUMENTS

| 5,082,518 | A   | * | 1/1992  | Molinaro   | H01L 21/67028 |
|           |     |   |         |            | 134/1.3       |
| 6,199,568 | B1  | * | 3/2001  | Arai       | H01L 21/67086 |
|           |     |   |         |            | 134/186       |
| 6,228,211 | B1  | * | 5/2001  | Jeong      | C03C 15/02    |
|           |     |   |         |            | 156/345.11    |
| 6,250,250 | B1  | * | 6/2001  | Maishev    | H01J 37/32009 |
|           |     |   |         |            | 118/723 ER    |
| 7,243,911 | B2  |   | 7/2007  | Abiko et al. |             |
| 7,807,017 | B2  | * | 10/2010 | Kim        | H01L 21/67086 |
|           |     |   |         |            | 156/345.11    |
| 8,020,839 | B2  | * | 9/2011  | Smiltneek  | B01F 3/0412   |
|           |     |   |         |            | 261/122.1     |
| 8,894,803 | B2  | * | 11/2014 | Ramirez    | H01L 31/02363 |
|           |     |   |         |            | 156/345.11    |
| 9,431,277 | B2  |   | 8/2016  | Hinode et al. |           |
| 10,559,480| B2  |   | 2/2020  | Kurasaki et al. |         |
| 10,978,316| B2  | * | 4/2021  | Nakaoka    | H01L 21/67057 |
| 2005/0072625 | A1 | * | 4/2005 | Christenson | H01L 21/67057 |
|           |     |   |         |            | 181/210       |
| 2008/0073030 | A1 |   | 3/2008 | Yoshino    |               |
| 2017/0309501 | A1 |   | 10/2017| Kitamura et al. |          |

(Continued)

FOREIGN PATENT DOCUMENTS

JP          3-71643 U       7/1991
JP          2000-147474 A   5/2000

(Continued)

*Primary Examiner* — Sylvia MacArthur
(74) *Attorney, Agent, or Firm* — Oblon, McClelland, Maier & Neustadt, L.L.P.

(57) ABSTRACT

A substrate treatment apparatus according to an embodiment includes a treatment tank to store a chemical solution to treat a substrate, a pipe having a discharge port through which an air bubble is discharged from a bottom of the treatment tank toward the substrate, and a rod body disposed between the discharge port and the substrate to divide the air bubble.

9 Claims, 7 Drawing Sheets

(56) References Cited

U.S. PATENT DOCUMENTS

| | | | |
|---|---|---|---|
| 2018/0082862 A1 | 3/2018 | Ashidate et al. | |
| 2018/0233383 A1 | 8/2018 | Ashidate et al. | |
| 2019/0259639 A1* | 8/2019 | Nakaoka | H01L 21/67057 |
| 2020/0273727 A1* | 8/2020 | Nakaoka | H01L 21/31111 |

FOREIGN PATENT DOCUMENTS

| | | | |
|---|---|---|---|
| JP | 2005-211718 A | 8/2005 | |
| JP | 2008-84903 A | 4/2008 | |
| JP | 2008-147637 A | 6/2008 | |
| JP | 4338612 B2 | 10/2009 | |
| JP | 2010-103379 A | 5/2010 | |
| JP | 2015-115456 A | 6/2015 | |
| JP | 2017-69529 A | 4/2017 | |
| JP | 2017-195338 A | 10/2017 | |
| JP | 2018-46262 A | 3/2018 | |
| JP | 2018-133551 A | 8/2018 | |
| JP | 2019-145686 A | 8/2019 | |
| JP | 2020-21822 A | 2/2020 | |
| TW | 201841686 A | 12/2018 | |

* cited by examiner

SUBSTRATE TREATMENT APPARATUS

CROSS-REFERENCE TO RELATED APPLICATIONS

This application is based upon and claims the benefit of priority from Japanese Patent Application No. 2019-029748, filed on Feb. 21, 2019; the entire contents of which are incorporated herein by reference.

FIELD

Embodiments of the present invention relate to a substrate treatment apparatus.

BACKGROUND

One of steps of processing a film formed on a substrate is a step of immersing the substrate into a chemical solution and etching the film. An example of a device for use in this etching step is a substrate treatment apparatus that discharges air bubbles into the chemical solution to increase a flow velocity of the chemical solution in a surface of the substrate.

DETAILED DESCRIPTION

Embodiments will now be explained with reference to the accompanying drawings. The present invention is not limited to the embodiments.

A substrate treatment apparatus according to an embodiment includes a treatment tank to store a chemical solution to treat a substrate, a pipe having a discharge port through which an air bubble is discharged from a bottom of the treatment tank toward the substrate, and a rod body disposed between the discharge port and the substrate to divide the air bubble.

First Embodiment

In the above described substrate treatment apparatus, the air bubbles are easy to gather above a discharge port of a pipe through which the air bubbles are discharged. Therefore, the flow velocity in the surface of the substrate may become non-uniform.

Figure 1:
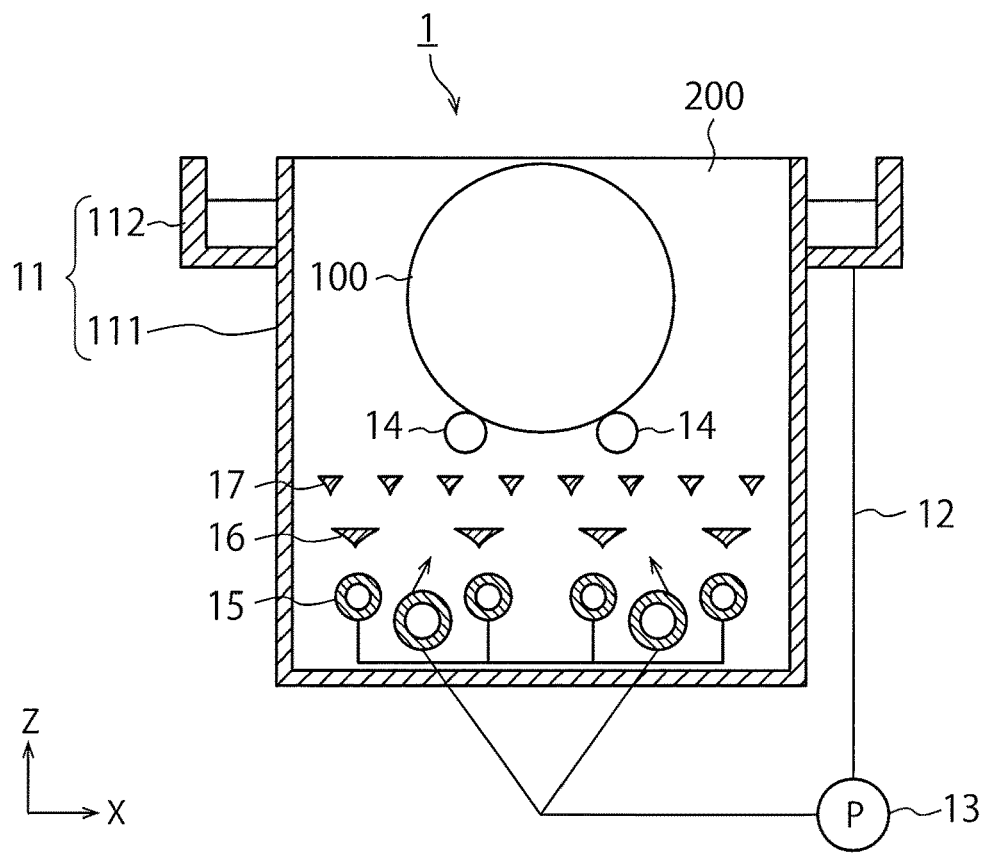
FIG. 1 is a schematic view of a substrate treatment apparatus according to a first embodiment.

FIG. 1 is a schematic view schematically showing a configuration of a substrate treatment apparatus according to an embodiment. A substrate treatment apparatus 1 shown in FIG. 1 is a batch type wet etching treatment device that collectively and selectively etches silicon nitride films (not shown) formed on a plurality of semiconductor substrates 100, respectively, with a chemical solution 200. The substrate treatment apparatus 1 according to the present embodiment includes a treatment tank 11, a circulation path 12, a pump 13, a lifter 14, a pipe 15, a first rod body 16, and a second rod body 17.

The treatment tank 11 has an inner tank 111 and an outer tank 112. An upper end of the inner tank 111 and an upper end of the outer tank 112 are open. The chemical solution 200 is stored in the inner tank 111. In the present embodiment, a phosphoric acid solution heated at about 160° C. is stored in the inner tank 111. The outer tank 112 recovers the chemical solution 200 that overflows from the inner tank 111.

The circulation path 12 communicates with a bottom of the outer tank 112 and a bottom of the inner tank 111, to circulate the chemical solution 200 between the inner tank 111 and the outer tank 112. The chemical solution 200 flowing out to the outer tank 112 is refluxed through the circulation path 12 to the inner tank 111.

The pump 13 is provided in the circulation path 12. The pump 13 suctions the chemical solution 200 from the outer tank 112, and pressurizes the suctioned chemical solution 200. Consequently, the chemical solution 200 recovered in the outer tank 112 returns to the inner tank 111.

Figure 2:
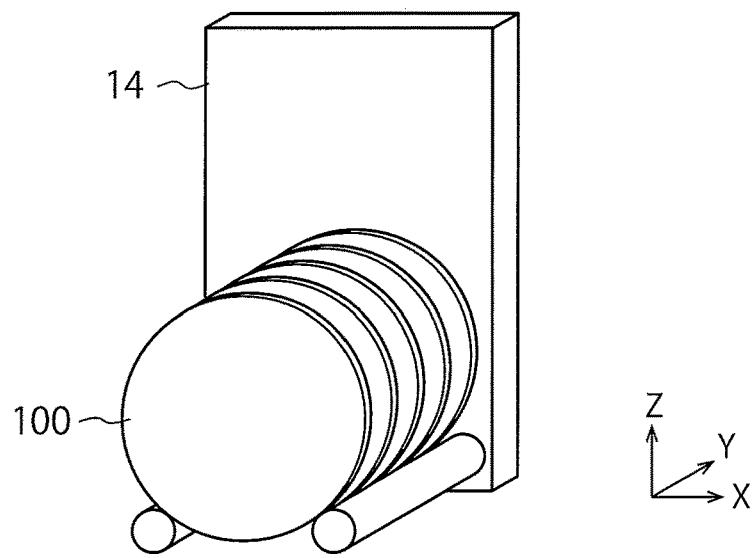
FIG. 2 is a perspective view showing an example of a holding configuration of a semiconductor substrate.

FIG. 2 is a perspective view showing an example of a holding configuration of a semiconductor substrate 100. In the inner tank 111, the lifter 14 holds a plurality of semiconductor substrates 100 arranged in a row in a Y-direction (a first direction). Furthermore, the lifter 14 lifts and lowers the held semiconductor substrate 100 in a Z-direction to the inner tank 111. The Z-direction is a vertical direction that is orthogonal to the Y-direction. By this lifting and lowering operation, the semiconductor substrate 100 prior to an etching treatment can be automatically immersed in the chemical solution 200 stored in the inner tank 111, and the semiconductor substrate 100 subjected to the etching treatment can be automatically removed from the inner tank 111.

As shown in FIG. 1, a plurality of pipes 15 are arranged along an X-direction (a second direction) in the bottom of the inner tank 111. The X-direction is a direction that is orthogonal to the Y-direction and the Z-direction. Each pipe 15 is, for example, a quartz pipe.

Above the pipes 15, a plurality of first rod bodies 16 are arranged in parallel with the pipes 15 in the X-direction. Above the first rod bodies 16, a plurality of second rod bodies 17 are arranged in the X-direction. Both ends of each first rod body 16 and both ends of each second rod body 17 are fixed to a side surface of the inner tank 111.

Figure 3:
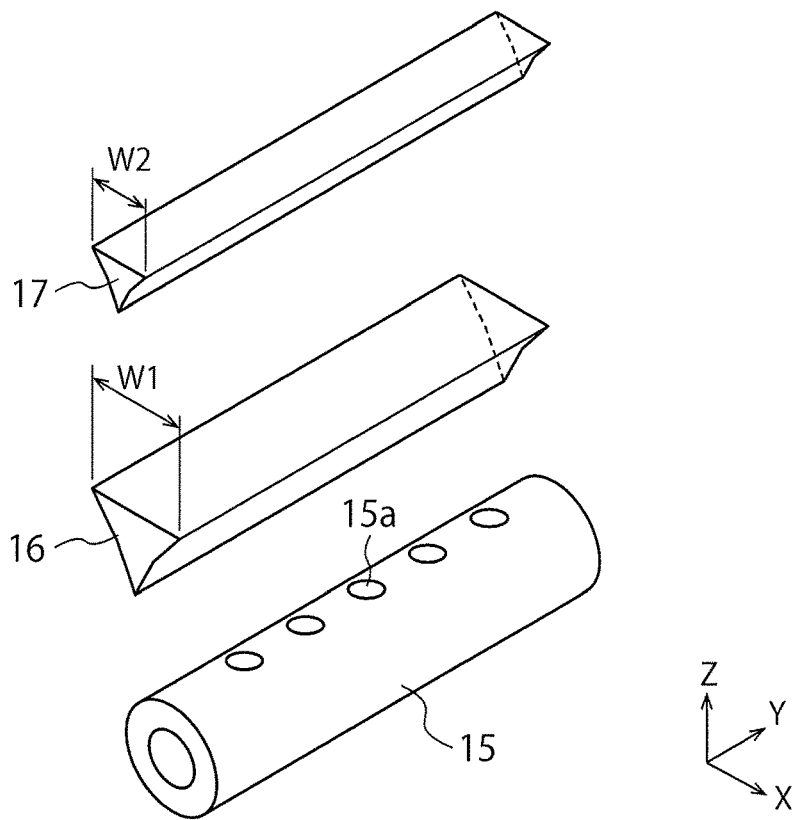
FIG. 3 is a perspective view schematically showing a structure of each of a pipe, a first rod body, and a second rod body.
Figure 4:
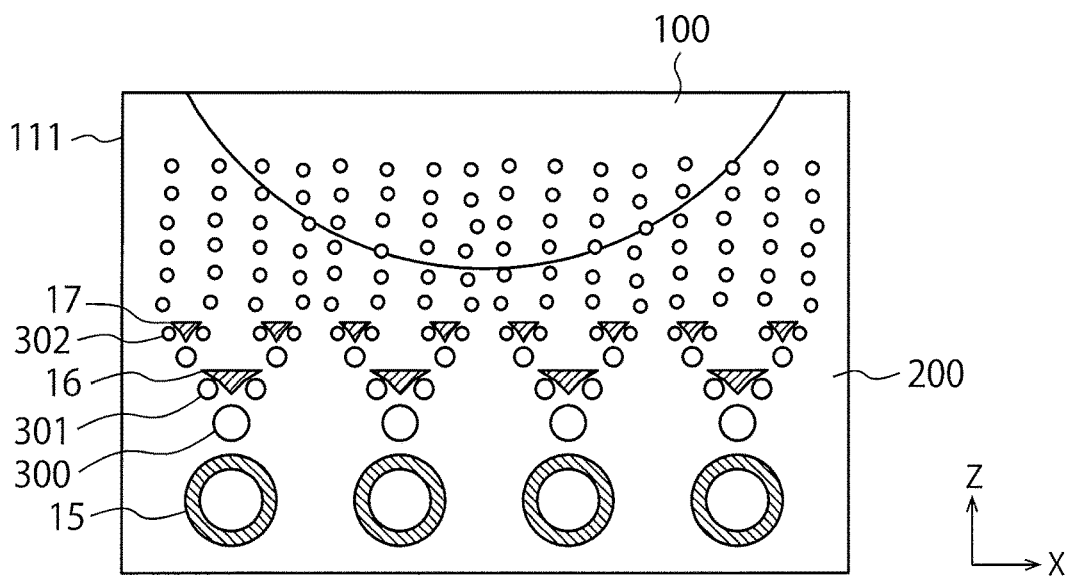
FIG. 4 is an enlarged view of a part of the substrate treatment apparatus according to the first embodiment.

FIG. 3 is a perspective view schematically showing a structure of each of the pipe 15, the first rod body 16, and the second rod body 17. Furthermore, FIG. 4 is an enlarged view of a part of the substrate treatment apparatus 1.

As shown in FIG. 3, the pipe 15 extends in the Y-direction, and a plurality of discharge ports 15a are formed along the Y-direction in an outer peripheral surface of the pipe. A nitrogen gas supplied from an exterior of the device flows in the pipe 15. Furthermore, as shown in FIG. 4, air bubbles 300 generated from the nitrogen gas are discharged from the respective discharge ports 15a toward the semiconductor substrate 100.

As shown in FIG. 3, the first rod body 16 extends in the Y-direction, and is disposed above the discharge ports 15a. As shown in FIG. 4, the air bubble 300 discharged from each discharge port 15a is divided into a plurality of air bubbles 301 by the first rod body 16. In the present embodiment, a cross sectional shape of the first rod body 16 is a wedge shape. However, the cross sectional shape of the first rod body 16 may be any shape as long as the body can divide the air bubble 300 discharged from each discharge port 15a, and the shape is not limited to the wedge shape.

As shown in FIG. 3, the second rod body 17 extends in the Y-direction in the same manner as in the first rod body 16, and is disposed to shift from the first rod body 16 in the X-direction. As shown in FIG. 4, the air bubbles 301 divided by the first rod body 16 are further divided into a plurality of air bubbles 302 by the second rod body 17. In the present embodiment, a cross sectional shape of the second rod body 17 is a wedge shape in the same manner as in the first rod body 16. Furthermore, a width W2 of the second rod body 17 in the X-direction is smaller than a width W1 of the first rod body 16 in the X-direction. However, the cross sectional shape of the second rod body 17 may be any shape as long as the body can further divide the air bubbles divided by the first rod body 16, and the shape is not limited to the wedge shape.

Hereinafter, description will be made as to manufacturing steps of the semiconductor device in which the substrate treatment apparatus 1 according to the present embodiment is used. Specifically, parts of manufacturing steps of a three-dimensional laminated type semiconductor storage in which electrode layers are laminated will be described.

Figure 5A:
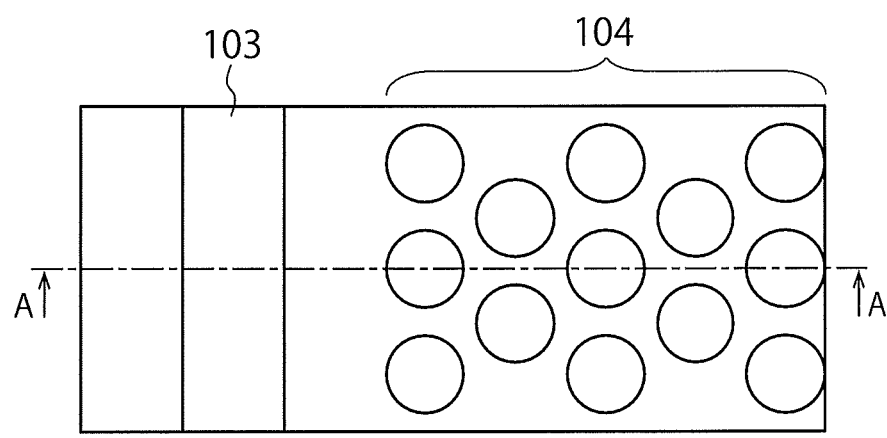
FIG. 5A is a plan view of a semiconductor device prior to etching.
Figure 5B:
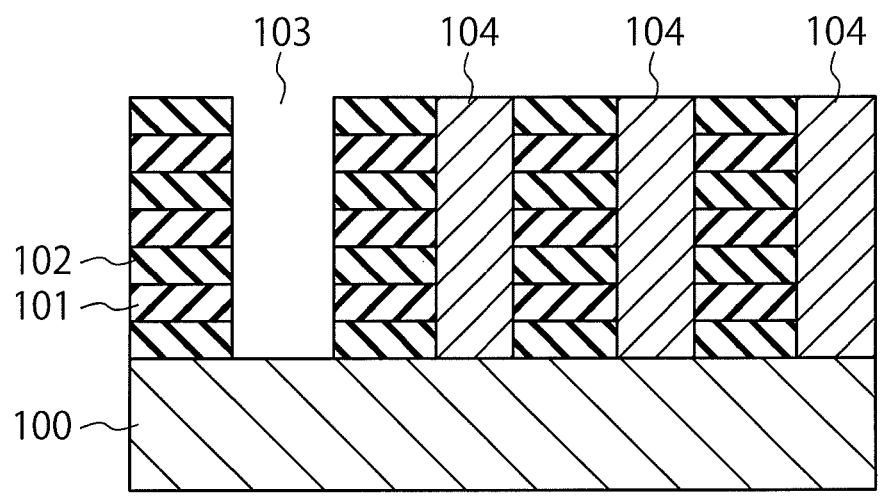
FIG. 5B is a cross sectional view taken along a cut line A-A shown in FIG. 5A.

FIG. 5A is a plan view of the semiconductor device prior to etching. FIG. 5B is a cross sectional view taken along a cut line A-A shown in FIG. 5A. As shown in FIG. 5B, silicon nitride films 101 and silicon oxide films 102 are alternately laminated on the semiconductor substrate 100. A laminate including the silicon nitride films 101 and the silicon oxide films 102 is separated by a slit 103. Furthermore, a plurality of pillar-like memory films 104 are formed in this laminate.

Figure 6:
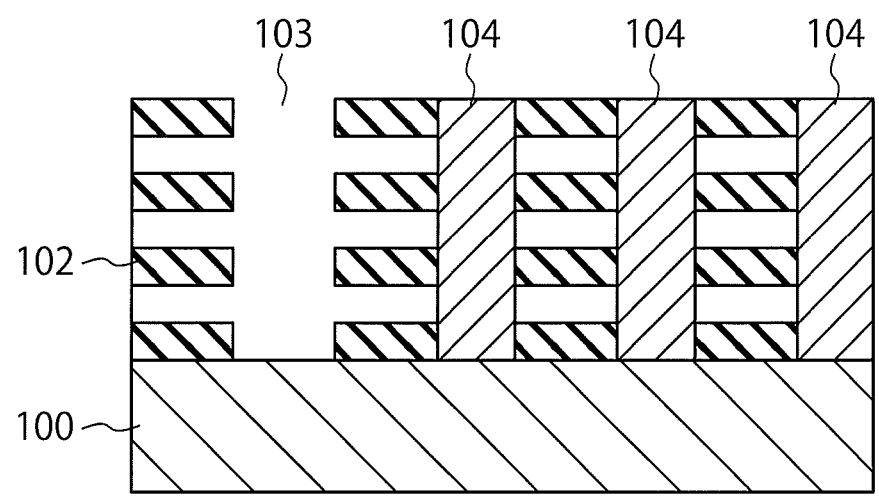
FIG. 6 is a cross sectional view of the semiconductor device after the etching.

When the semiconductor substrate 100 is immersed into the chemical solution 200 stored in the inner tank 111 by use of the lifter 14, the chemical solution 200 permeates from the slit 103 into the laminate. As a result, the silicon nitride films 101 are selectively etched to the silicon oxide films 102 as in a cross sectional view shown in FIG. 6. After the etching of the silicon nitride films 101 ends, the semiconductor substrate 100 is carried out from the inner tank 111 by the lifter 14.

During this etching of the above described silicon nitride films 101, the air bubbles 300 are discharged from the discharge ports 15a of each pipe 15. If the substrate treatment apparatus 1 does not include the first rod bodies 16 and the second rod bodies 17, the air bubbles 300 are easy to gather above the discharge ports 15a. The air bubbles 300 rise only above the discharge ports 15a, and the air bubbles 300 are not present in the Z-direction of a region where there are not any discharge ports 15a, so that a flow velocity easily becomes non-uniform in a plane of the semiconductor substrate 100.

Furthermore, when diameters of the air bubbles 300 are large, the flow velocity excessively increases. In this case, a selection ratio of silicon nitride to silicon oxide decreases. That is, a film thickness of the memory film 104 becomes non-uniform. Consequently, there is concern that an etching defect occurs and that electrical characteristics of the semiconductor device deteriorate due to variations in the characteristics.

To solve the problem, it is considered that a diameter of each discharge port 15a of the pipe 15 is decreased to decrease a diameter of each air bubble 300. However, when the pipe 15 is the quartz pipe, it is difficult to process a hole having a small diameter.

On the other hand, in the present embodiment, as shown in FIG. 4, the air bubble 300 discharged from each discharge port 15a is divided into the plurality of air bubbles 301 by the first rod body 16. Furthermore, the air bubbles 301 are divided into the plurality of air bubbles 302 by the second rod body 17. Consequently, the air bubbles 302 having a small diameter can be discharged toward the semiconductor substrate 100. Therefore, it is possible to improve uniformity of the flow velocity in the plane of the semiconductor substrate 100.

Furthermore, the selection ratio of silicon nitride to silicon oxide can be increased, and hence, the etching defect indicating that the film thickness of each memory film 104 becomes non-uniform can be avoided. Furthermore, it is not necessary to decrease the diameter of the discharge port 15a, and hence, advanced hole processing is not required for the pipe 15.

Note that the substrate treatment apparatus 1 according to the present embodiment includes two-stage rod bodies including the first rod body 16 and the second rod body 17 to divide the air bubbles, but a number of the stages of the rod bodies may be at least one. Furthermore, the first rod body 16 and the second rod body 17 may have the same rod body cross sectional shape as in the present embodiment, or may have different cross sectional shapes.

Second Embodiment

Figure 7:
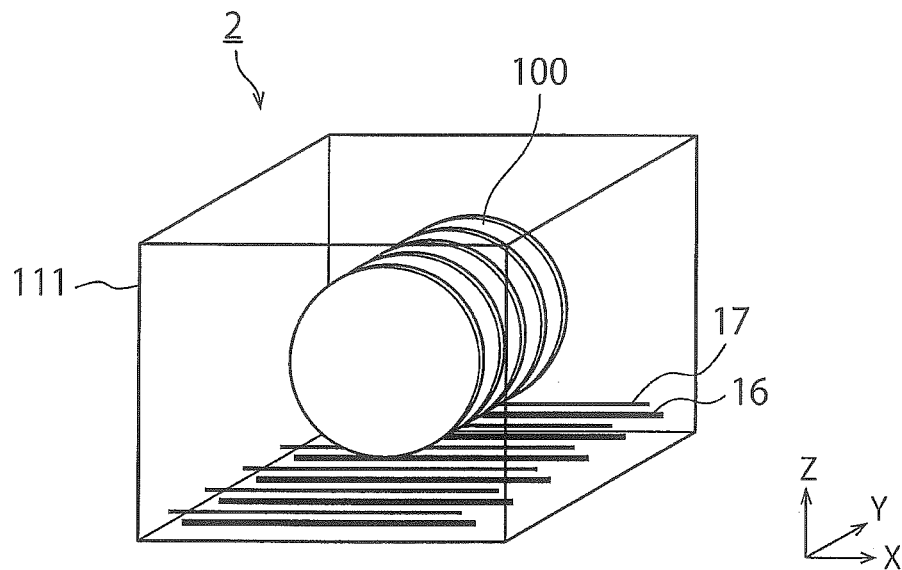
FIG. 7 is a perspective view showing a schematic configuration of a substrate treatment apparatus according to a second embodiment.

FIG. 7 is a perspective view showing a schematic configuration of a substrate treatment apparatus according to a second embodiment. FIG. 7 shows a main configuration different from the above described first embodiment. Description of a similar configuration is omitted. That is, FIG. 7 omits drawing of an outer tank 112, a circulation path 12, a pump 13, a lifter 14, and a pipe 15.

In the above described first embodiment, the first rod body 16 and the second rod body 17 extend in the vertical direction to the wafer-like semiconductor substrate 100, that is, the Y-direction. On the other hand, in the present embodiment, a first rod body 16 and a second rod body 17 extend in a direction parallel to a semiconductor substrate 100, that is, an X-direction as shown in FIG. 7. Note that an unshown pipe 15 is parallel to the first rod body 16 in a bottom of an inner tank 111 in the same manner as in the first embodiment.

Figure 8:
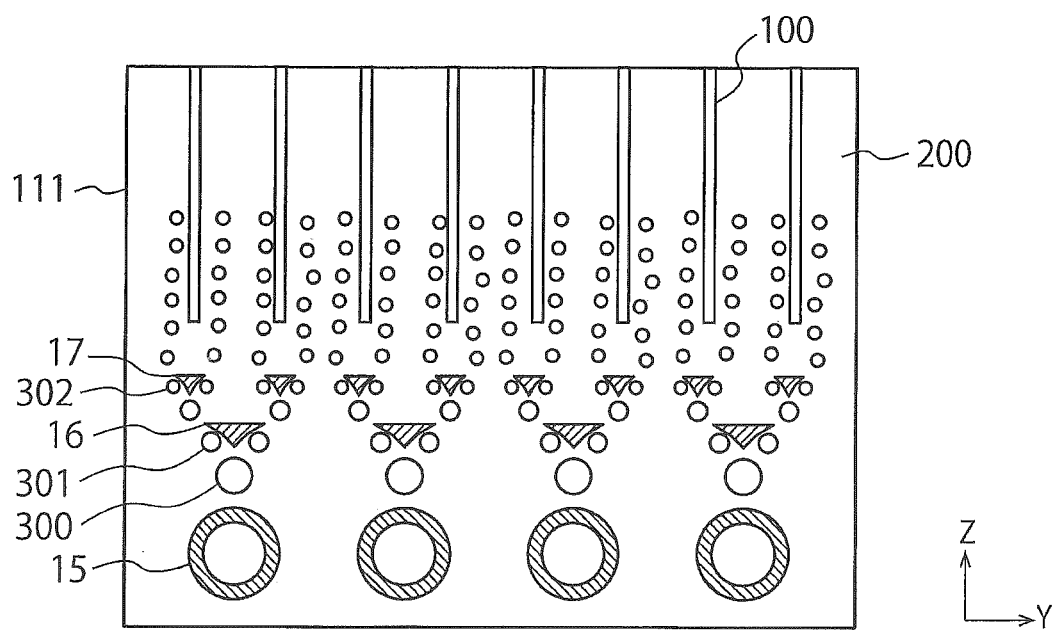
FIG. 8 is an enlarged view of a part of the substrate treatment apparatus according to the second embodiment.

FIG. 8 is an enlarged view of a part of a substrate treatment apparatus 2. As shown in FIG. 8, in the substrate treatment apparatus 2, a plurality of first rod bodies 16 are arranged in a Y-direction above discharge ports 15a. Furthermore, a plurality of second rod bodies 17 are arranged to shift from the first rod bodies 16 in the Y-direction. A plurality of semiconductor substrates 100 are held by a lifter 14 (not shown in FIG. 8) right above the plurality of second rod bodies 17.

Also in the substrate treatment apparatus 2 having the above described configuration, an air bubble 300 is discharged from each discharge port 15*a* during etching of a silicon nitride film 101 formed on the semiconductor substrate 100 in the same manner as in the first embodiment. This air bubble 300 is divided into a plurality of air bubbles 301 by the first rod body 16. Furthermore, the air bubbles 301 are divided into a plurality of air bubbles 302 by the second rod body 17. Consequently, the air bubbles 302 having a small diameter can be inserted between the semiconductor substrates 100.

Therefore, according to the present embodiment, it is possible to improve uniformity of a flow velocity in a plane of the semiconductor substrate 100, even when the pipe 15 is not subjected to advanced hole processing.

(Modification)

Figure 9:
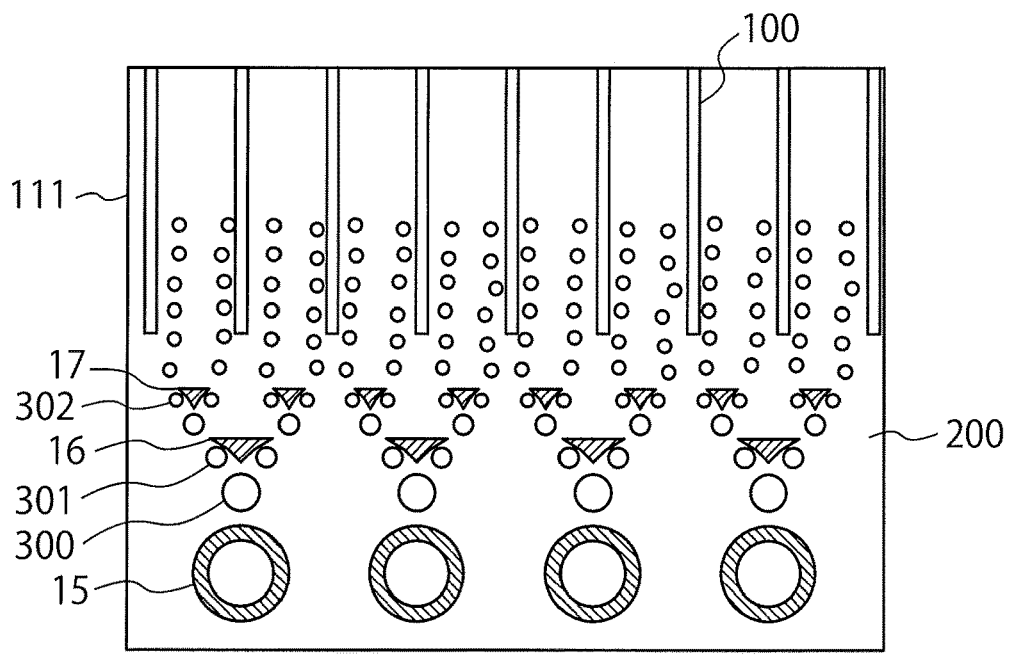
FIG. 9 is an enlarged view showing a modification of the second embodiment.

FIG. 9 is an enlarged view showing a modification of the second embodiment. In the above described second embodiment, the plurality of semiconductor substrates 100 are held right above the plurality of second rod bodies 17. On the other hand, in the present modification, a plurality of semiconductor substrates 100 are held among second rod bodies 17 as shown in FIG. 9.

Also in the modification having the above described configuration, each air bubble 300 discharged from a pipe 15 is divided into a plurality of air bubbles 301 by a first rod body 16, and each air bubble 301 is further divided into a plurality of air bubbles 302 by the second rod body 17. Therefore, even when the plurality of semiconductor substrates 100 are held among the second rod bodies 17, the air bubbles 302 having a small diameter are inserted between the semiconductor substrates 100.

Therefore, also in the present modification, it is possible to improve uniformity of a flow velocity in a plane of the semiconductor substrate 100, even when the pipe 15 is not subjected to advanced hole processing.

Third Embodiment

Figure 10:
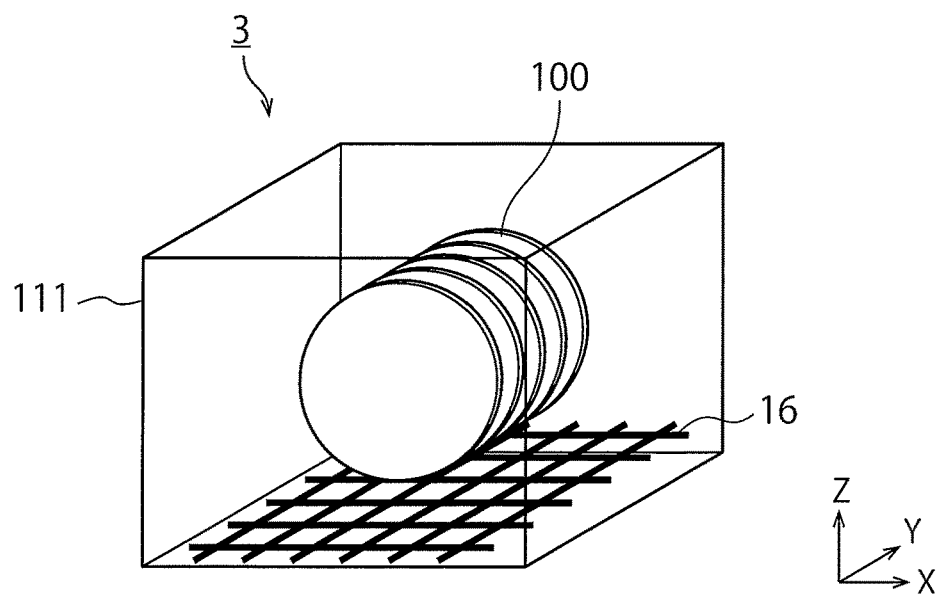
FIG. 10 is perspective view showing a schematic configuration of a substrate treatment apparatus according to a third embodiment.

FIG. 10 is perspective view showing a schematic configuration of a substrate treatment apparatus according to a third embodiment. FIG. 10 shows a main configuration different from the above described first embodiment. Description of a similar configuration is omitted. That is, FIG. 10 omits drawing of an outer tank 112, a circulation path 12, a pump 13, a lifter 14, and a pipe 15.

In a substrate treatment apparatus 3 according to the present embodiment, as shown in FIG. 10, a plurality of first rod bodies 16 are arranged in a grid. That is, a plurality of first rod bodies 16 extending in an X-direction are orthogonal to a plurality of first rod bodies 16 extending in a Y-direction. The plurality of first rod bodies 16 extending in the X-direction may be in contact with or away from the plurality of first rod bodies 16 extending in the Y-direction.

According to the present embodiment, a gap between the first rod bodies 16 is small, and hence, an air bubble 300 discharged from each pipe 15 can be divided into finer air bubbles 301. Consequently, it is possible to further improve uniformity of a flow velocity in a plane of the semiconductor substrate 100.

Figure 11:
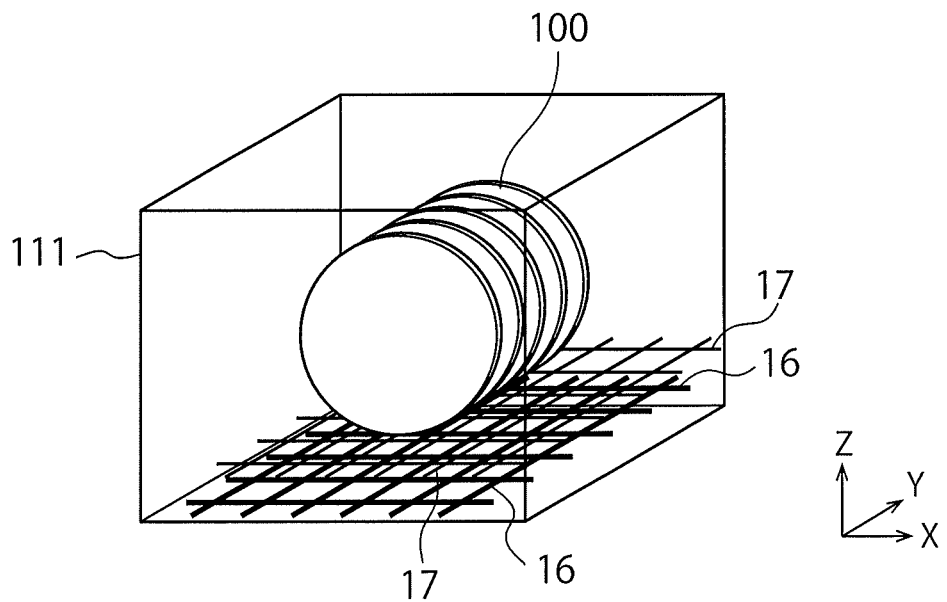
FIG. 11 is a perspective view showing a schematic configuration of a substrate treatment apparatus according to a modification of the third embodiment.

Note that in the present embodiment, as shown in FIG. 11, a plurality of second rod bodies 17 arranged in a grid may be arranged on the plurality of first rod bodies 16. In this case, the air bubbles 301 finely divided by the first rod body 16 are further finely divided by the second rod body 17.

Fourth Embodiment

Figure 12:
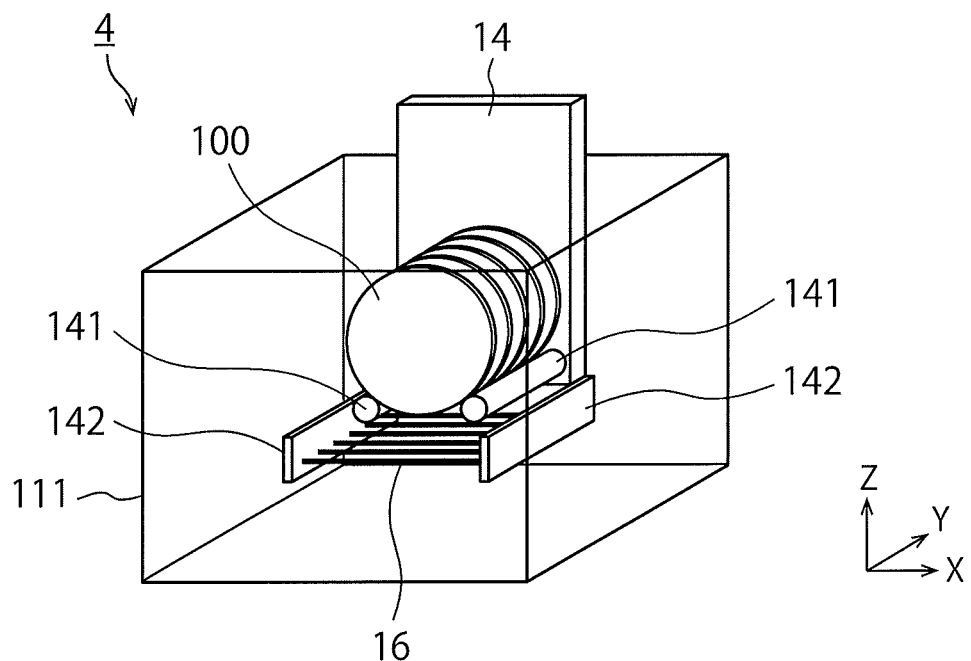
FIG. 12 is a perspective view showing a schematic configuration of a substrate treatment apparatus according to a fourth embodiment.

FIG. 12 is a perspective view showing a schematic configuration of a substrate treatment apparatus according to a fourth embodiment. FIG. 12 shows a main configuration different from the above described first embodiment. Description of a similar configuration is omitted. That is, FIG. 12 omits drawing of an outer tank 112, a circulation path 12, a pump 13, and a pipe 15.

In the above described first embodiment to third embodiment, the first rod bodies 16 are fixed to a side surface of the inner tank 111.

On the other hand, in a substrate treatment apparatus 4 shown in FIG. 12, a plurality of first rod bodies 16 are fixed to a lifter 14. The lifter 14 has a pair of support rods 141 extending in a Y-direction, and a pair of plate-like members 142 extending below the support rods 141 in the Y-direction. Each of a plurality of semiconductor substrates 100 is held between the pair of support rods 141. Furthermore, both ends of each of the plurality of first rod bodies 16 extending in an X-direction are fixed to the pair of plate-like members 142.

Also in the above described present embodiment, an air bubble discharged from each pipe 15 is divided by the first rod body 16 and can be inserted between the semiconductor substrates 100. Consequently, it is possible to improve uniformity of a flow velocity in a plane of the semiconductor substrate 100.

Note that also in the present embodiment, the second rod body 17 may be disposed between the first rod body 16 and the semiconductor substrate 100 in the same manner as in the other embodiments. In this case, each air bubble can be further finely divided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A substrate treatment apparatus comprising:
    a treatment tank to store a chemical solution to treat a plurality of substrates,
    a pipe having a discharge port through which an air bubble is discharged from a bottom of the treatment tank toward the substrate, and
    a plurality of rod bodies disposed with a gap between each other, and between the discharge port and the substrates to divide the air bubble, wherein
    a cross sectional shape of the rod bodies is a wedge shape and the rod bodies are disposed with an apex of the wedge shape facing the discharge port side, and
    the substrates are arranged along a first direction and are held in the treatment tank, and the rod bodies extend in the first direction, and are arranged along a second direction orthogonal to the first direction, and
    the rod bodies comprise a plurality of first rod bodies arranged above the discharge port in the second direction, and a plurality of second rod bodies arranged shifted from the plurality of first rod bodies in the second direction, between the plurality of first rod bodies and the substrates, and wherein the rod bodies are configured with the apex of the wedge shape to divide the air bubble with a collision with the air bubble.

2. The substrate treatment apparatus according to claim 1, wherein the plurality of first rod bodies and the plurality of second rod bodies are arranged along the first direction, and the plurality of substrates are held right above the plurality of second rod bodies.

3. The substrate treatment apparatus according to claim 1, wherein the plurality of first rod bodies and the plurality of second rod bodies are arranged along the first direction, and the plurality of substrates are held among the plurality of second rod bodies.

4. The substrate treatment apparatus according to claim 1, wherein a plurality of rod bodies are arranged in a grid.

5. The substrate treatment apparatus according to claim 1, further comprising a lifter holding the substrate, wherein the rod body is fixed to the lifter.

6. The substrate treatment apparatus according to claim 1, wherein widths of the second rod bodies are smaller than those of the first rod bodies.

7. A substrate treatment apparatus comprising:
a treatment tank to store a chemical solution to treat a plurality of substrates,
a pipe having a discharge port through which an air bubble is discharged from a bottom of the treatment tank toward the substrates, and
a plurality of rod bodies disposed with a gap between each other, and between the discharge port and the substrates to divide the air bubble, wherein
a cross sectional shape of the rod bodies is a wedge shape and the rod bodies are disposed with an apex of the wedge shape facing the discharge port side, and
the substrates are arranged along a first direction and are held in the treatment tank, and the rod bodies extend in a second direction orthogonal to the first direction and are arranged along the first direction, and
the rod bodies comprise a plurality of first rod bodies arranged above the discharge port in the first direction, and a plurality of second rod bodies arranged shifted from the plurality of first rod bodies in the first direction, between the plurality of first rod bodies and the substrates, and
wherein the rod bodies are configured with the apex of the wedge shape to divide the air bubble with a collision with the air bubble.

8. The substrate treatment apparatus according to claim 7, wherein the plurality of first rod bodies and the plurality of second rod bodies are arranged along the first direction, and the plurality of substrates are held right above the plurality of second rod bodies.

9. The substrate treatment apparatus according to claim 7, wherein the plurality of first rod bodies and the plurality of second rod bodies are arranged along the first direction, and the plurality of substrates are held among the plurality of second rod bodies.

* * * * *